United States Patent [19]

Reynolds et al.

[11] Patent Number: 5,361,764
[45] Date of Patent: Nov. 8, 1994

[54] MAGNETIC RESONANCE IMAGING FOOT COIL ASSEMBLY

[75] Inventors: Francis D. Reynolds, Port Jefferson Station; Joseph S. Baran, Holtsville; Robert P. Bisey, Seaford; Terry Button, East Patchogue; Robert E. McGill, Dix Hills; Nathan I. Nalven, Mount Sinai; Matthew A. Salvitti, Patchogue, all of N.Y.

[73] Assignee: Grumman Aerospace Corporation, Bethpage, N.Y.

[21] Appl. No.: 87,905

[22] Filed: Jul. 9, 1993

[51] Int. Cl.⁵ .............................................. A61B 5/055
[52] U.S. Cl. .................................. 128/653.5; 324/318
[58] Field of Search .......................... 128/653.2, 653.5; 324/309, 318, 322; 600/13, 15

[56] References Cited

U.S. PATENT DOCUMENTS

| | | |
|---|---|---|
| 4,617,936 | 10/1986 | Malko . |
| 4,672,972 | 6/1987 | Berke . |
| 4,707,664 | 11/1987 | Fehn . |
| 4,721,913 | 1/1988 | Hyde . |
| 4,721,914 | 1/1988 | Fukushima . |
| 4,724,389 | 2/1988 | Hyde et al. ........................ 324/318 |
| 4,733,190 | 3/1988 | Deurbinski . |
| 4,739,269 | 4/1988 | Kopp . |
| 4,774,468 | 9/1988 | Bydder . |
| 4,776,341 | 10/1988 | Bachus . |
| 4,784,146 | 11/1988 | Mancuso . |
| 4,791,371 | 12/1988 | Krol . |
| 4,793,356 | 12/1988 | Misic . |
| 4,817,612 | 4/1989 | Akins . |
| 4,831,330 | 5/1989 | Takahasi . |
| 4,870,363 | 9/1989 | Yassine . |
| 4,875,485 | 10/1989 | Matsutani . |
| 4,897,604 | 1/1990 | Carlson . |
| 4,918,388 | 4/1990 | Mehdizadeh . |
| 4,920,318 | 4/1990 | Misic . |
| 4,932,411 | 6/1990 | Fritschy . |
| 4,960,106 | 10/1990 | Kubokawa . |
| 4,968,936 | 11/1990 | Darasse . |
| 5,007,425 | 4/1991 | Vanek . |
| 5,024,229 | 6/1991 | Bryant . |
| 5,035,231 | 7/1991 | Kubokawa . |
| 5,042,487 | 8/1991 | Marquardt . |
| 5,050,605 | 9/1991 | Eydelman et al. ............... 128/653.5 |
| 5,050,607 | 9/1991 | Bradley . |
| 5,063,933 | 11/1991 | Takahashi . |
| 5,085,219 | 2/1992 | Ortendahl et al. ............... 128/653.5 |
| 5,130,656 | 7/1992 | Bequardt . |
| 5,136,244 | 8/1992 | Jones . |
| 5,139,024 | 8/1992 | Bryant . |
| 5,143,068 | 9/1992 | Muennemann . |
| 5,154,417 | 10/1992 | Shah . |
| 5,170,789 | 12/1992 | Narayan . |
| 5,185,577 | 2/1993 | Minemura ........................... 324/318 |
| 5,277,183 | 1/1994 | Vij ..................................... 128/653.5 |

FOREIGN PATENT DOCUMENTS

| | | |
|---|---|---|
| 107238 | 5/1984 | European Pat. Off. . |
| 191180 | 8/1986 | European Pat. Off. . |
| 2604890 | 4/1988 | France . |
| 453533 | 2/1992 | Japan . |
| 4322639 | 11/1992 | Japan ................................ 128/653.5 |
| 4354934 | 12/1992 | Japan ................................ 128/653.5 |
| 5076510 | 3/1993 | Japan ................................ 128/653.5 |

*Primary Examiner*—K. M. Pfaffle
*Attorney, Agent, or Firm*—Carl J. Evens; Richard G. Geib

[57] ABSTRACT

A magnetic resonance imaging receiver system for producing high resolution images of the foot and ankle regions of a human subject. The magnetic resonance imaging receiver comprises an antenna for receiving resonance signals produced by a magnetic resonance imaging, radio frequency excitation magnetic apparatus, a free standing foot cradle assembly for supporting and rigidly holding the foot and ankle of the subject, and a tuning/impedance matching circuit for providing for the maximum transfer of radio frequency energy from the antenna to the receiver unit in the magnetic resonance imaging, radio frequency excitation magnet apparatus. The system utilizes fixed local coils which operate in the receive only mode for receiving electromagnetic signals from resonating nuclei produced by a whole body MRI scanner system or the like to produce high quality images.

22 Claims, 7 Drawing Sheets

MAGNETIC RESONANCE IMAGING FOOT COIL ASSEMBLY

BACKGROUND OF THE INVENTION

1. Field of the Invention

The present invention relates to Magnetic Resonance Imaging (MRI) devices, and more particularly, to MRI devices designed to image a particular body part or region. The present invention utilizes fixed local coils for receiving electromagnetic signals from resonating nuclei produced by a whole body MRI scanner system or the like to produce high quality images.

2. Discussion of the Prior Art

MRI is a well known technique wherein an object, animate or inanimate, which is placed in a spatially varying magnetic field is subjected to a pulse of Radio Frequency (RF) radiation, and the resulting nuclear magnetic resonance spectra are combined to give cross-sectional images of the object. The MRI technique is possible because the human body contains an abundance of hydrogen atoms, whose nuclei are protons, in its tissues, and these protons respond to electromagnetic manipulation, which is obviously essential in MRI. Generally, an MRI apparatus operates by the application of an RF excitation field in the presence of other magnetic fields and the subsequent sensing and analysis of the resulting nuclear magnetic resonance produced in the body.

Any nucleus which possesses a magnetic moment tends to align itself with the direction of the magnetic field in which it is located. Accordingly, when a substance such as human tissue is subjected to a static magnetic field, the individual magnetic moments of the protons in the tissue attempt to align with this polarizing magnetic field. However, the protons precess around the direction of the field at a characteristic angular frequency, known as the Larmor frequency, which is dependent on the strength of the magnetic field and the properties of the specific nuclear species. Once in the polarizing magnetic field, the alignment of the protons exist in one of two possible energy states which describe the spin angular momentum of the protons. Classically, the protons precess, that is, each proton's axis of rotation generally describes a cone and tends to turn at an angle relative to the direction of the applied polarizing magnetic field. The protons precess in a random order in terms of the phase of rotation. A net macroscopic magnetic moment is produced in the direction of the polarizing field, but the randomly orientated magnetic components in the perpendicular or transverse plane to the polarizing magnetic field cancel one another. If however, the substance or tissue is subjected to an RF radiation pulse which is in the plane transverse to the polarizing magnetic field and which is at or near the Larmor frequency, the net aligned moment may be rotated or tipped into the transverse plane to produce a net transverse magnetic moment which is rotating or spinning in the transverse plane at or near the Larmor frequency. Essentially, the pulse of RF radiation is utilized to achieve resonance and produce a phase coherence such that the precessing protons are no longer random in phase, but rather at a single phase orientation. The degree to which the net magnetic moment is tipped, and hence the magnitude of the net transverse magnetic moment depends primarily on the duration of time and the magnitude of the applied RF radiation signal.

The practical value of the above described phenomenon resides in the signal which is emitted by the protons when the RF radiation pulse is terminated. Basically, a measurement is performed on the resonance signal emitted as feedback by the protons during the period when their magnetic moments tend to re-align themselves with the polarizing magnetic field. The measured signal is then processed in order to extract therefrom cross-sectional images of the tissues or organs under examination. Essentially, as the protons are precessing and travelling back towards alignment within the polarizing magnetic field, they are "cutting" the plane of receiving antenna which is part of the MRI device; accordingly, a current is induced in the receiving antenna as explained by Faraday's Law. From this induced current or Electro-Motive Force (EMF) signal, a map of the proton density of the tissue being imaged and its relaxation times, which is the time necessary for the protons to realign themselves with the polarizing magnetic field is generated. This feedback signal is processed and is ultimately transformed into a series of images of the tissue.

Various types of receiving antennas or coils have been designed for MRI applications. The most commonly utilized antenna is the standard sized whole body coil which is dimensioned to be disposed around the entire body of the patient to be imaged. Due to the standard sizing, a significant void or empty region is defined between the coil and the portion of the patient to be imaged. As the imaged portion of the patient becomes a smaller fraction of the coil volume, the signal-to-noise ratio decreases, thereby degrading the image quality. In addition, the coil receives resonance signals from over a significantly larger area than the region of interest. This sensitivity to extraneous information degrades the spatial resolution and increases aliasing in the two and three dimensional Fourier Transform methodology utilized in processing the resonance signals.

The typical form of the MRI device employing the above described whole body coil is a tubular member or tunnel into which the individual is placed. This type of arrangement, when used for applying an RF field, does not result in a high quality homogeneous field, nor is it efficient in the generation of the field. In addition, many individuals do not feel comfortable when placed in a tube, especially, those individuals who exhibit claustrophobic tendencies.

SUMMARY OF THE INVENTION

The present invention is directed to a magnetic resonance imaging receiver system for producing high resolution images of the foot and ankle regions of a human subject. The magnetic resonance imaging receiver system comprises an antenna for receiving resonance signals produced by a magnetic resonance imaging, radio frequency excitation magnet apparatus, i.e. a standard MRI device, a free standing foot cradle assembly for supporting and rigidly holding the foot and ankle of the subject, and a tuning/impedance matching circuit for providing the maximum transfer of radio frequency energy from the antenna to a receiver unit in the magnetic resonance imaging, radio frequency excitation magnet apparatus. The antenna comprises two antenna or imaging coils arranged on parallel plates which are positioned on either side of the foot and ankle regions of the subject. The foot cradle assembly houses the two antenna coils and ensures that the two coils are fixed at a predetermined distance from one another, and maintains them in a parallel orientation such that the resonance signals are not biased by the orientation of the two antenna coils. The tuning/impedance matching circuit also comprises the circuitry necessary for linking the magnetic resonance imaging receiver system to the magnetic resonance imaging, radio frequency excitation magnet apparatus.

The foot cradle assembly serves three essential functions; namely, housing the two antenna coils, supporting and holding the foot and ankle of the subject, and housing the tuning/impedance matching circuit. The foot cradle assembly comprises two double walled side walls into which the antenna coils are mounted, a nosepiece which is integral to the double walled side walls, and having connectors mounted therein for connecting the two antenna coils to the tuning/impedance matching circuit, and a base which serves as a platform for the nosepiece and double walled side walls. Two lengthwise side rails are utilized to reinforce the platform against abuse, and incorporate two slots for restraining straps which are utilized for holding the individual's foot in place. The nosepiece is tapered along its length and curved in cross-section so that it would be extremely difficult for an individual wearing the foot cradle assembly to walk on the foot cradle assembly and damage the unit. The foot cradle assembly is lined with foam for easy customization of the foot cradle assembly to the subject's foot. In addition, the foam provides for a comfortable fit. Further customization is possible by constructing the foot cradle assembly in various sizes. A small foot cradle assembly would be utilized to accommodate children's feet, medium to accommodate the average sized individual's foot, and large to accommodate extremely large feet or possibly casts. A lower section of the nosepiece comprises a removable tray which fits securely into the base of the foot cradle assembly, and is locked into an upper section of the nosepiece with a non-ferrous screw. The tray comprises a bracket for installing a circuit board upon which the tuning/impedance matching circuit is mounted. It is also possible to mount the tuning/impedance matching circuit directly to the foot cradle assembly, thereby eliminating the need for an extra component. The tuning/impedance matching circuit comprises a single matching network which is adjustable or tunable to provide for a maximum transfer of energy from the antenna coils to the pre-amplifier of the receiver unit in MRI device. The antenna coils are fabricated on circuit boards which fit snuggly into the two double walled side walls of the foot cradle assembly.

The magnetic resonance imaging receiver system of the present invention provides a simple and effective device for producing high resolution images of the foot and ankle regions of a human subject. The magnetic resonance imaging receiver system is a light weight, easily transportable device which utilizes existing technology that is compatible with any standard MRI device to produce improved resolution images. Improved resolution images are achieved by providing a foot cradle assembly which houses the imaging or antenna coils immediately adjacent to the foot of the subject, and by providing a stable holding fixture for the foot relative to the imaging coils. Currently available MRI devices are not as capable of producing high quality images as the magnetic resonance imaging receiver system of the present invention.

The magnetic resonance imaging receiver system of the present invention is easily operated by a technician and provides a high level of comfort for the subject undergoing examination. The construction of the foot cradle assembly provides for the simple customization of the foot cradle assembly to the subject's foot in order to account for varying foot sizes and shapes, thereby making for a comfortable fit. In addition, when utilized, the subject need only place his/her foot into the MRI device. Accordingly, whereas prior imaging techniques and devices required that the individual be placed inside a confined space, now the individual need only place his/her foot inside the confined space, thereby avoiding any claustrophobic feelings. This is an important feature because even though an individual may not be claustrophobic, typical MRI applications require a more than inconsequential period of time, and the limited space environment of standard whole body MRI devices are not known as being comfortable. Additionally, since the system is light weight, subjects should have no problem manipulating their leg with the foot cradle assembly attached thereto. It should be noted, however, that the subject's foot along with the foot cradle assembly should be held still during the actual MRI process. A wide and heavy base prevents the foot cradle assembly from tipping over, thereby minimizing the possibility of damage to the receiver system and possible injury to the subject by a sudden twisting motion caused by a tipping foot cradle assembly.

The magnetic resonance imaging receiver system of the present invention is designed in such a manner, and constructed from materials such that it is inexpensively manufactured as well as simple to repair if necessary. A modular design is utilized in the construction of the foot cradle assembly such that the imaging coils and the tuning/impedance matching circuit are easily removed from the foot cradle assembly. The foot cradle assembly itself is constructed from any suitably rigid, non-ferrous material and finished so that the entire foot cradle assembly creates a non-obtrusive appearance and promotes a favorable tactile response. In addition, the foot cradle assembly is designed such that it can be easily cleaned and readied for the next subject.

DETAILED DESCRIPTION OF THE PREFERRED EMBODIMENTS

The magnetic resonance imaging receiver system of the present invention provides for the generation of high resolution images of the foot and ankle regions of a human subject. The magnetic resonance imaging receiver system comprises an antenna for receiving resonance signals produced in the human subject by a standard MRI device, a free standing foot cradle assembly 10 for supporting and holding the foot and ankle of the subject, and a tuning/impedance matching circuit for providing maximum energy transfer between the antenna and the MRI device. The subject undergoing MRI diagnostic examination places his/her foot inside the foot cradle assembly and then the foot and foot cradle assembly are placed within the tube or tunnel of the MRI device. Accordingly, clean high quality images are produced while the subject remains in a comfortable position outside of the tube of the MRI device.

Figure 1:
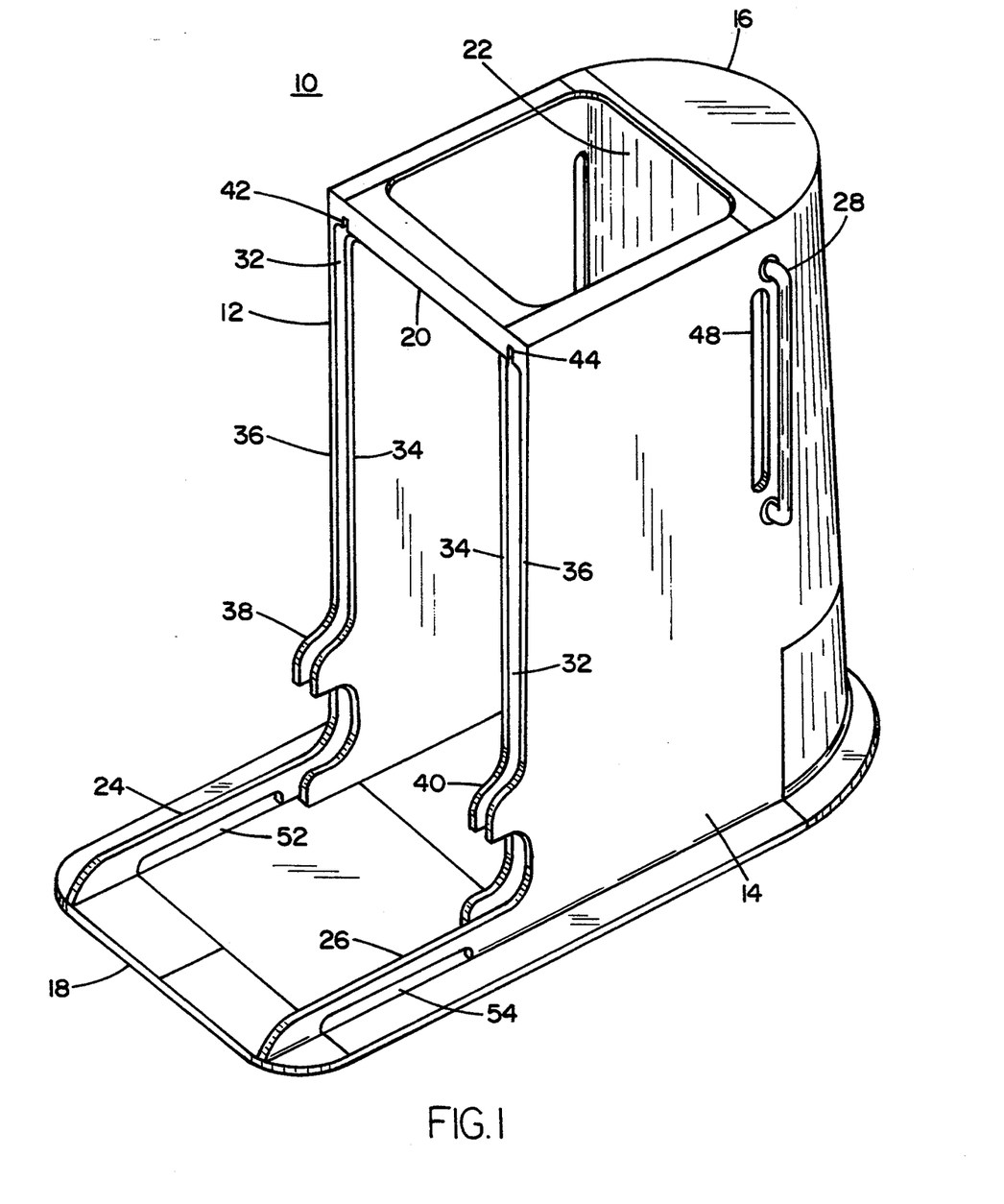
FIG. 1 is a frontal view schematic representation of the foot cradle assembly of the present invention.
Figure 2:
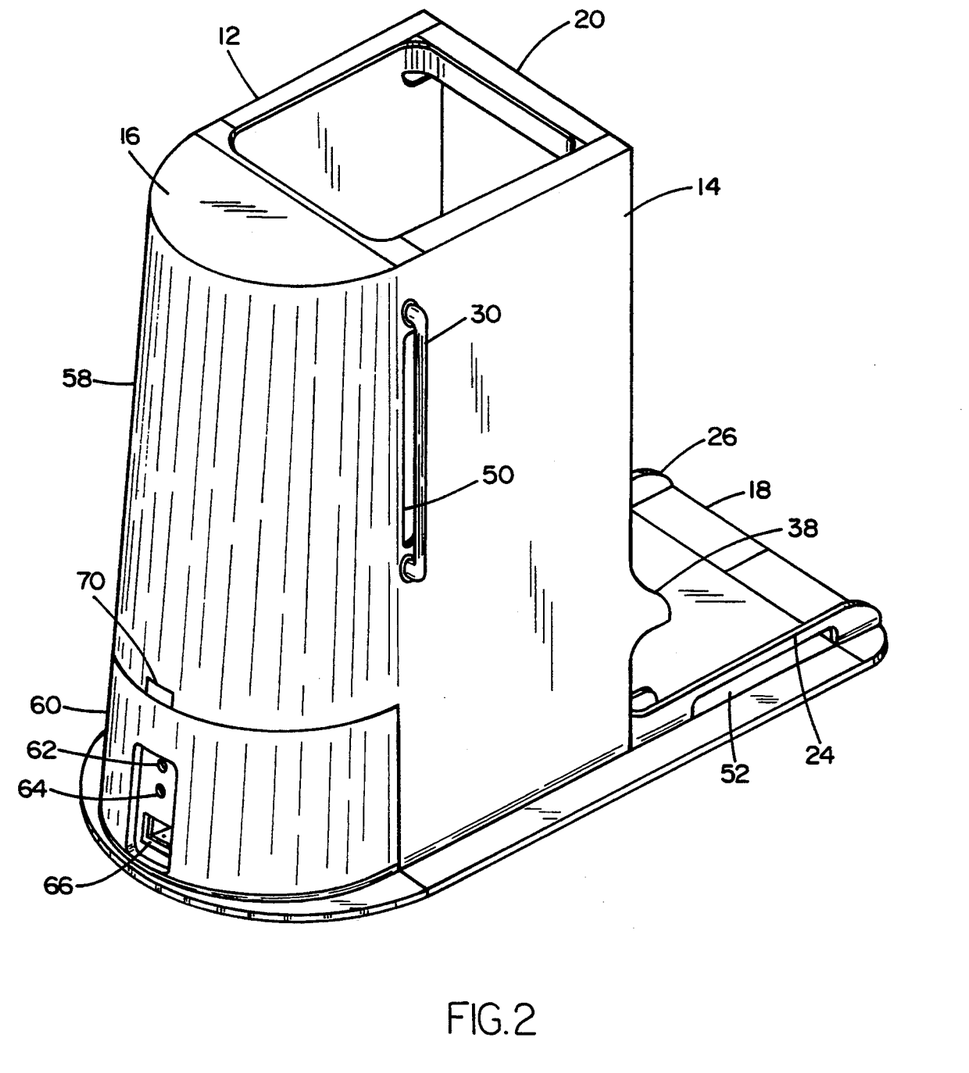
FIG. 2 is a rear view schematic representation of the foot cradle assembly of the present invention.

Referring to FIG. 1, there is shown a frontal view schematic representation of the foot cradle assembly 10 of the magnetic resonance imaging receiver system. The foot cradle assembly 10 comprises two double walled side walls 12 and 14, which house the antenna, a nosepeice section 16 which is positioned between and connects the rear edges of the double walled side walls 12 and 14, a base 18 which serves as a platform for the double walled side walls 12 and 14 and the nosepeice 16, a transverse bar 20 mounted between the double walled side walls 12 and 14 and opposite the nosepeice 16, a transverse wall 22 mounted between the double walled side walls 12 and 14 directly over the nosepeice 16, two side rails 24 and 26 connecting the double walled side walls 12 and 14 with the base 18 for adding strength and rigidity thereto, and restraining handles 28 and 30, one of which is shown in FIG. 1, and the other which is shown in FIG. 2. The subject's foot is placed within the foot cradle assembly 10 such that the subject's heel rests upon the transverse wall 22 and his/her toes point towards the direction of the transverse bar 20. The subject's foot along with the foot cradle assembly 10 is then placed in the MRI device and rests upon its base 18 such that the subject's foot would be in the normal position of an individual sitting with his/her feet in the extended position.

The two double walled side walls 12 and 14 have a space or gap 32 between their inner and outer surfaces 34 and 36. The space or gap 32 in each of the double walled side walls 12 and 14 is utilized to house a pair of circuit boards, each of which have the single antenna coil mounted thereon. A complete description of the antenna coils, including a description of how the antenna coils are positioned within the double walled side walls 12 and 14, is given subsequently. Each of the double walled side walls 12 and 14 comprise tabs 38 and 40 for the easy insertion and removal of these circuit boards. There are close fitting slots 42 and 44 in the top portion of the double walled side walls 12 and 14, and close fitting slots, not shown, in the bottom portion of the double walled side walls 12 and 14, which secure the circuit boards in place. The transverse bar 20 is mounted along the top edge of the double walled side walls 12 and 14 and parallel to the transverse wall 22 which covers the nosepeice 16. The transverse bar 20 is utilized to provide support for the foot cradle assembly 10, to maintain the double walled side walls 12 and 14 is a parallel orientation with respect to one another, and to serve as a handle for carrying the foot cradle assembly 10. The maintenance of the parallel orientation of the double walled side walls 12 and 14 is essential to the optimal operation of the magnetic resonance imaging receiver system as is explained subsequently.

Figure 8:
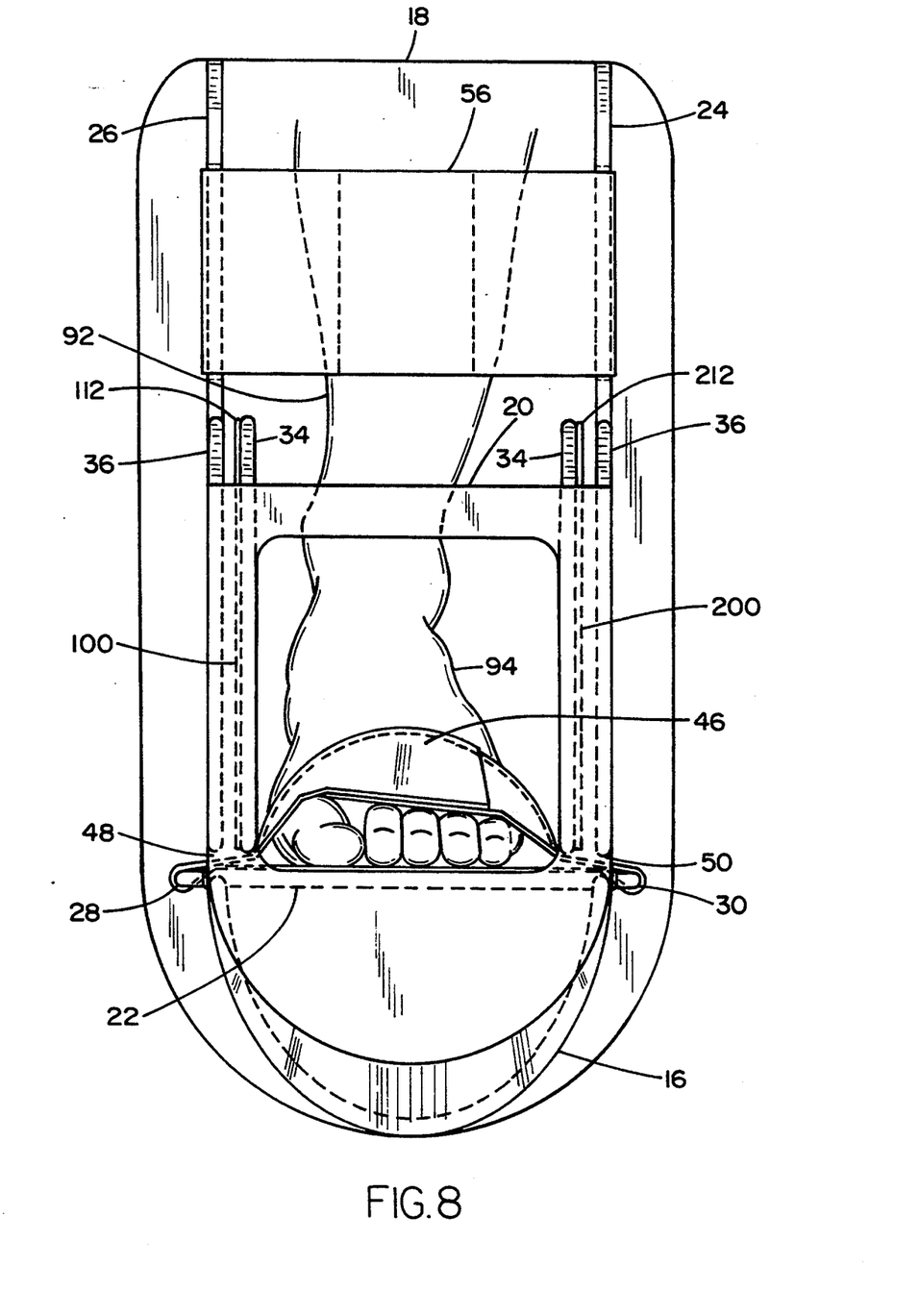
FIG. 8 is a top view schematic representation of the foot cradle assembly of the present invention.

The nosepiece 16 which is formed as an integral part of the double walled side walls 12 and 14 is tapered along its length and curved in cross-section to provide a semicircular shape to prevent subjects from attempting to walk with the foot cradle assembly 10 attached to their leg. Since the nosepiece 16 is semicircular in shape, the transverse wall 22 is needed to serve as a backstop for the foot of the subject. Once the individual's foot is in place within the foot cradle assembly 10, a toe/foot restraining strap 46, as shown in FIG. 8, which is connected to the restraining handles 28 and 30, is fed through slots 48 and 50 in the junction region between the double walled side walls 12 and 14 and the nosepiece 16, is utilized to securely hold the subject's foot in place within the foot cradle assembly 10. FIG. 8 is a top view of the foot cradle assembly 10 illustrating the positioning and securing of the toe/foot restraining strap 46 and is discussed in detail subsequently. It is important that the subject's toes and foot are held immobile to ensure high quality images. One slot 48 through which the restraining strap 46 is fed is shown in FIG. 1 and the second slot 50, which is on the opposite side of the foot cradle assembly 10 is shown in FIG. 2.

The base 18 which is formed as an integral part of the double walled sidewalls 12 and 14 and the nosepiece 16 serves as a platform for the nosepiece 16 and double walled side walls 12 and 14. The base 18 of the foot cradle assembly 10 is the functional equivalent of the back portion of the upper part of a boot in that the subject's leg and heel rest upon the base 18. The length of the base 18 is such that there is sufficient support for the subject's leg, and that the foot cradle assembly 10 itself is stable. In addition, the width of the base 18 is greater than the perimeter formed by the double walled side walls 12 and 14 and the nosepiece 16. The base 18 is also heavier than the other sections of the foot cradle assembly 10. The extra wide and heavier base 18 prevents the empty foot cradle assembly 10 from easily tipping over, thereby preventing damage to the foot cradle assembly 10. Additionally, the extra wide and heavier base 18 prevents the foot cradle assembly 10 from easily tipping over while the subject's foot is within the foot cradle assembly 10, thereby preventing possible injury to the subject by a sudden twisting movement. The two side rails 24 and 26 provide for the stiffening of the foot cradle assembly 10 by effectively extending the lower portion of the double walled side walls 12 and 14 over the majority of the length of the base 18. The side rails 24 and 26 also contain slots 52 and 54 therein for a shin restraining strap 56, also shown in FIG. 8. The shin restraining strap 56 would secure the shin region of a subject's foot to prevent movement thereof. The side rails 24 and 26 are utilized to provide anchor members for the shin restraining strap 56.

Figure 3:
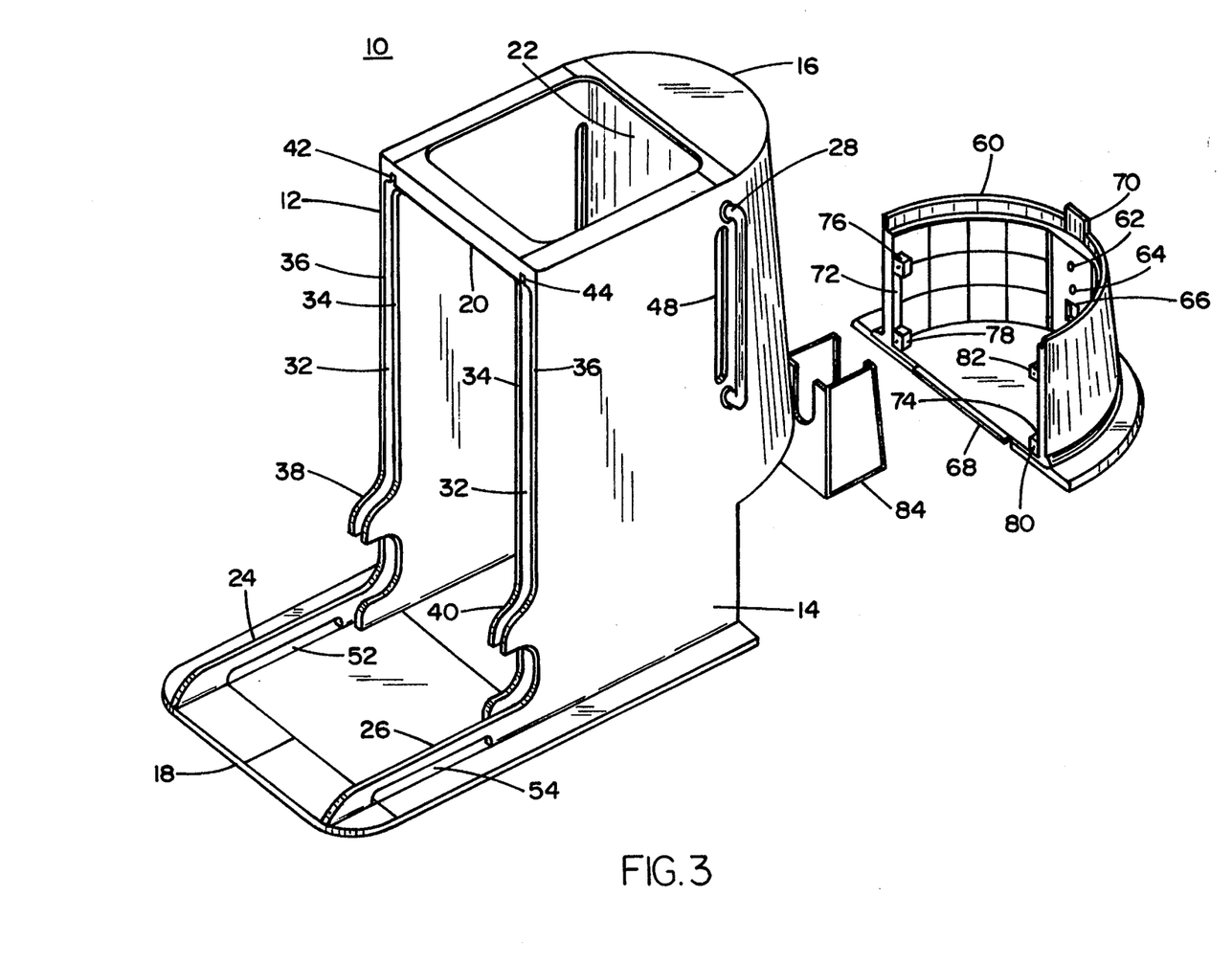
FIG. 3 is an exploded view schematic representation of the foot cradle assembly of the present invention.

Turning to FIG. 2, there is shown a schematic rear view of the foot cradle assembly 10 of the magnetic resonance imaging receiver system. As is shown in FIG. 2, the nosepiece 16 is divided into an upper section 58 and a lower section 60. The upper section 58 comprises only empty space between itself and the transverse wall 22. The lower section 60, however, comprises a removable tray which locks into both the base 18 and the upper section 58 of the nosepiece 16. The tray comprises a bracket for installing the circuit board upon which the tuning/impedance matching circuit is mounted. The rear portion of the lower section 60 of the nosepeice 16 has two adjustment ports 62 and 64 for adjusting the tuning/impedance matching circuit, and a connection port 66 for connecting the magnetic resonance imaging receiver system to the MRI device. The connection between the magnetic resonance imaging receiver system to the MRI device is made via a coaxial cable which easily plugs into the connection port 66 on the foot cradle assembly 10 and the connector port on the MRI device. FIG. 3 illustrates an exploded schematic view of the foot cradle assembly 10, specifically showing the lower section 60 of the nosepiece 16 removed from the foot cradle assembly 10. The lower section 60 comprises a tongue 68 which is inserted into a groove section of the base 18, which is not shown, thereby forming a tongue and groove joint for locking the lower section 60 of the nosepiece 16 into the foot cradle assembly 10. A tab 70 which is mounted to the upper edge of the lower section 60 comprises a hole through which a screw or bolt is inserted to secure the lower section 60 to the upper section 58. In addition, connector mounts 72 and 74 are attached to the lower section 60 of the nosepiece 16. These connector mounts 72 and 74 are utilized to secure a pair of spring loaded press fit electrical connectors which provide an electrical connection between the antenna coils and the tuning/impedance matching circuit. The pair of spring loaded press fit electrical connectors are mounted to the connector mounts 72 and 74 via bolts or screws which fit into holes 76, 78, 80 and 82. A complete description of the spring loaded press fit electrical connectors is given subsequently with reference to FIG. 6. The tray 84 which houses the tuning/impedance matching circuit fits snuggly into the lower section 60 of the nosepiece 16. It should be noted that the tray 84 would not be needed if the tuning/impedance matching circuit is mounted directly to a wall in the lower section 60 of the nosepiece 16.

The foot cradle assembly 10 must be manufactured from a material that is suitably rigid and durable, but which is also non-ferrous and having no mobile protons. It is essential that the foot cradle assembly 10 be constructed from non-ferrous elements so as not to interfere with the magnetic field produced by the MRI device. In addition, there must be no mobile protrons, because mobile protons would appear and alter the image. Accordingly, various plastics, which have no mobile protons, can be utilized to form the foot cradle assembly 10. The prototype of the foot cradle assembly 10 was manufactured utilizing a plastic resin. A wide variety of plastic forming techniques can be utilized to fabricate the foot cradle assembly 10; however, for production purposes, injection molding would be preferable. If the foot cradle assembly 10 is to be painted, the paint must not contain any ferrous materials which would interfere with the magnetic field or any mobile protons for the reasons explained above. Additionally the antenna coils and tuning/impedance matching circuit are also constructed from non-ferrous materials for the same reasons.

The inside surfaces of the foot cradle assembly 10 are lined with foam. The foam adapts to the contours of the subject's foot, thereby creating a custom fit. A closed cell foam is preferred to prevent absorption of fluids, such as blood if the patient is bleeding. Further customization is possible by designing the foot cradle assembly 10 in various sizes, for example, small to accommodate children's feet, medium to accommodate the average sized individual's foot, and large to accommodate extremely large feet or possibly casts. Accordingly, all the dimensions of the elements which comprise the foot cradle assembly 10 would have to be modified including the size of the antenna coils. In addition, the tuning/impedance matching circuit would have to be modified. Modification as described above is necessary to ensure that both the foot and ankle regions lie within the optimal areas of the antenna coils and that the tuning/impedance matching circuit is configured for the newly sized foot cradle assembly 10. The reasons for this are explained subsequently.

Figure 4:
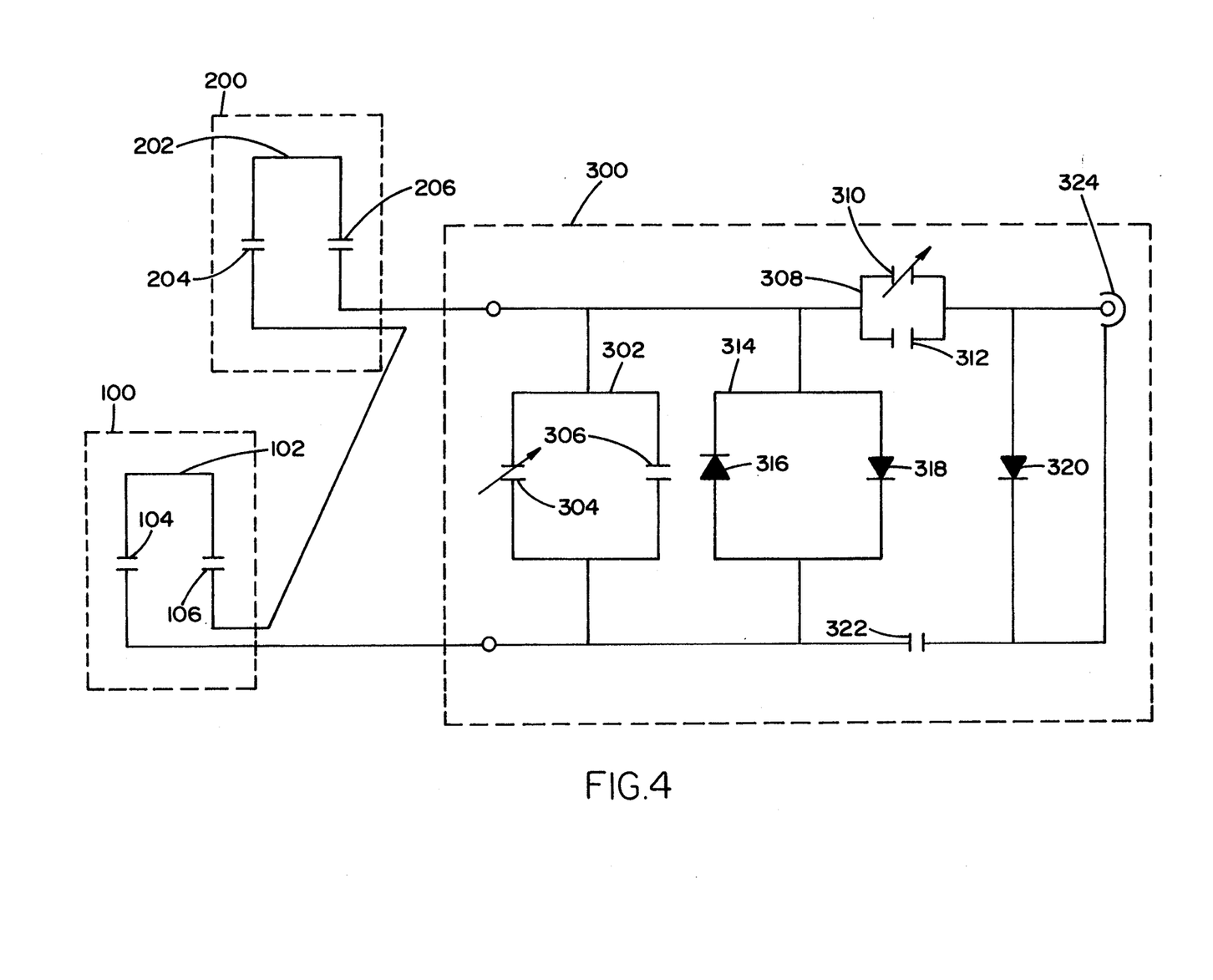
FIG. 4 is a schematic representation of the antenna coils and tuning/impedance matching circuit of the present invention.

Referring now to FIG. 4, the there is shown a schematic representation of the two antenna coils and the tuning/impedance matching circuit. The antenna coils are utilized to capture the signals which are emitted by the hydrogen nuclei in the region of interest during the MRI process; namely, the foot and ankle regions of the subject. The tuning/impedance matching circular conditions the signals captured by the antenna coils for transmission to the MRI device. In the MRI device, the signals are processed in order to extract therefrom cross-sectional images of the tissues under examination. The two antenna coils and the tuning/impedance matching circuit are mounted on three individual circuit boards 100, 200, and 300 respectively. The two antenna coils have a left/right symmetry, but are otherwise identical. Additionally, all circuit elements are fabricated from non-ferrous materials so as not to interfere with the magnetic fields generated by the MRI device.

Figures 5, 6:
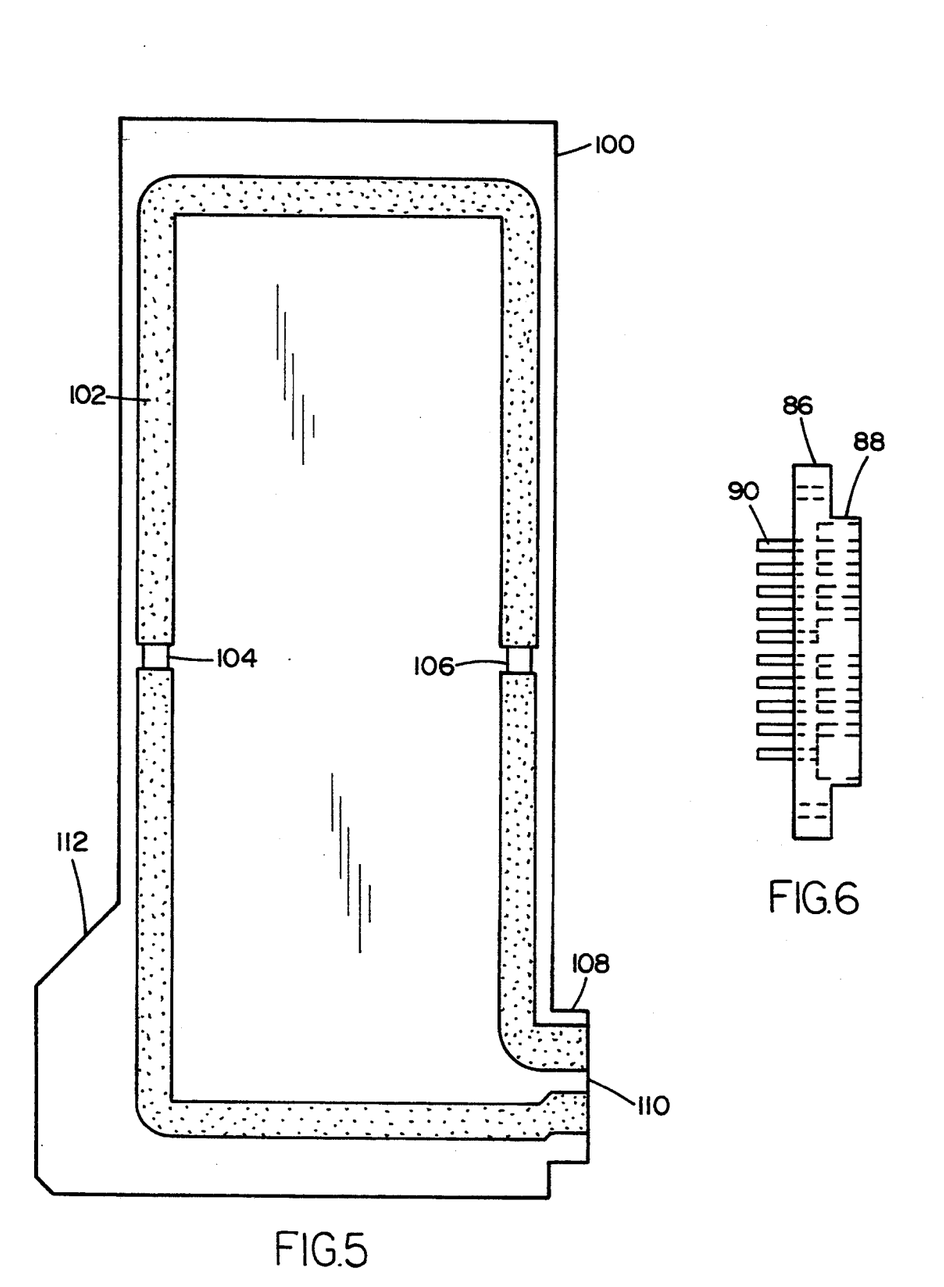
FIG. 5 is a diagrammatic representation of a single printed circuit board having an antenna coil mounted thereon.
FIG. 6 is a schematic representation of a spring loaded press fit electrical connector.
Figure 7:
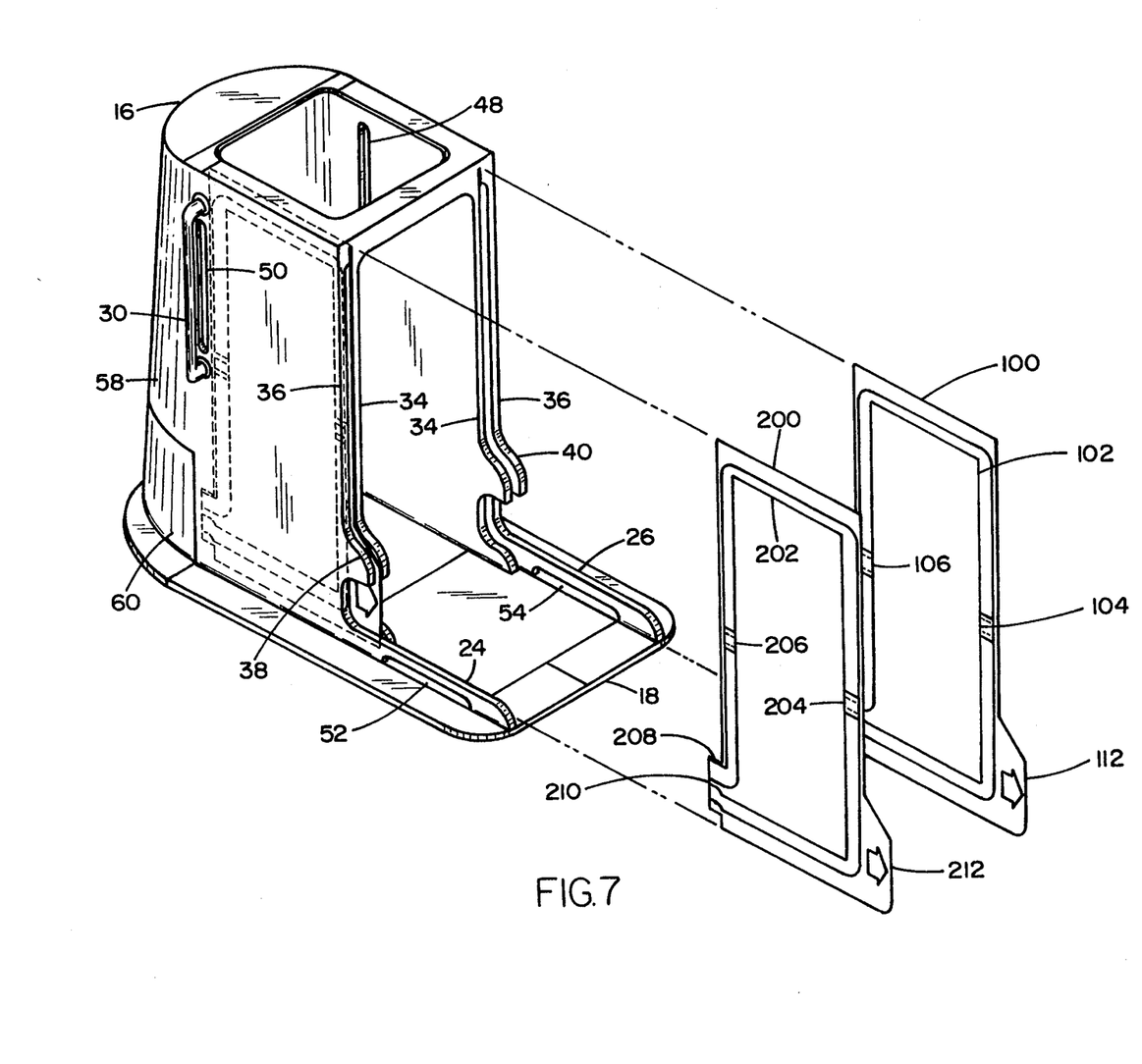
FIG. 7 is a perspective view of the foot cradle assembly and two printed circuit boards each having an antenna coil mounted thereon.

The antenna coils 102 and 202 function in a receive only mode in conjunction with the main MRI, radio frequency excitation magnet assembly. As is stated above, the two antenna coil circuit boards 100 and 200 are identical, other than a left/right reversal for mounting on each side of the foot cradle assembly 10, shown in FIGS. 1-3, and discussed in detail previously. The two antenna coil circuit boards 100 and 200 are held inside the double walled side walls 12 and 14 by close fitting slots 42 and 44 in the upper portion of the double walled side walls 12 and 14 and by close fitting slots, not shown, in the lower portion of the double walled side walls 12 and 14, and by insertion into the spring loaded press fit electrical connectors which are attached to the connector mounts 72 and 74, shown in FIG. 3. These spring loaded press fit electrical connectors are standard devices which are well known in the art. FIGS. 6 and 7 provide a detailed illustration of the placement of the two antenna coil circuit boards 100 and 200 within the double walled side walls 12 and 14 and their electrical connection to the tuning/impedance matching circuit. Each antenna coil circuit board 100 and 200 is fabricated from single clad two ounce copper deposited on 0.062 inch thick fiber-glass epoxy printed circuit board material. The fabrication of the two antenna coils 102 and 202 is accomplished by standard techniques which are well known in the art. The two antenna coils 102 and 202 are fabricated as a 0.5 inch copper trace in a rectangular coil configuration by a standard etching process performed on the circuit boards 100 and 200. The copper trace is then plated with tin to prevent oxidation. The metallic traces forming the antenna coils 102 and 202 are located on the outboard surfaces of the circuit boards 100 and 200 for increased subject safety without degradation to system performance. Two sets of capacitors 104, 106 and 204, 206 are incorporated into the antenna coils 102 and 202 respectively. The capacitors 104, 106, 204 and 206 are surface mount capacitors which are easily mounted onto the circuit boards 100 and 200. The capacitors 104, 106, 204, and 206 are connected in series with each of the antenna coils 102 and 202. The two sets of capacitors 104, 106 and 204, 206 serve two functions; namely, resonating the inductor to operate at the Larmor frequency, and to force a uniform magnetic field between the two antenna coils 102 and 202. In order to resonate at the Larmor frequency and thereby be in synchronization with the resonating protons, the self inductance characteristics of the coils 102 and 202 are measured, as well as the solenoid effect between the adjacent antenna coils 102 and 202, and then capacitance values are calculated for a series LC circuit which achieves resonance at the predetermined frequency. The values of the capacitance needed are calculated for the inductance which exists when the foot cradle assembly 10 is empty. The locations of the four capacitors 104, 106, 204 and 206 are chosen specifically so that a uniform magnetic field is provided within the volume occupied by the foot and ankle under examination. In addition to the exact placement of the four capacitors 104, 106, 204 and 206, the antenna coils 102 and 202 must be maintained in a parallel orientation with respect to each other for the same reason. Any shift in the orientation of the antenna coils 102 and 202 destroys the uniformity of the magnetic field, thereby degrading system performance. Accordingly, any change in the dimensions of the foot cradle assembly 10 and the antenna coils 102 and 202, would require recalculating the capacitance values because of the change in inductance. The interconnection between the two antenna coils 102 and 202 and their respective connection to the tuning/impedance matching circuit is accomplished via a one inch braided conductive strapping to minimize ohmic and skin effect loses.

Referring to FIG. 5, there is shown a detailed view of the single antenna coil 102 mounted on the printed circuit board 100. As is shown in the figure, the antenna coil 102 is essentially rectangular in shape and comes to an open end termination region 108 on an end tab 110 of the printed circuit board 100. Basically, the termination region 108 of the antenna coil 102 is the region where each end of the antenna coil 102 are in close proximity of each other in order to complete the circuit. The end tab 110 is inserted into the spring loaded press fit electrical connector, thereby providing electrical contact with the termination region 108 of the antenna coil 102. A forward tab 112 is utilized to insert and remove the printed circuit board 100 into and from the foot cradle assembly 10. The two capacitors 104 and 106 are surface mounted capacitors as discussed above. Turning to FIG. 6, there is shown a single spring loaded press fit electrical connector 86. The end tab 110 of the printed circuit board 100 is pressed into the spring loaded press fit electrical connector 86 thereby providing a plurality of contact points between the termination region 108 of the antenna coil 102 and the contacts 88 of the spring loaded press fit electrical connector 86. The one inch braided conductive strapping which connects the two antenna coils 102 and 202 to the tuning/impedance matching circuit attaches to the connection ports 90 of the spring loaded press fit electrical connector 86.

The tuning/impedance matching circuit or network is mounted on the circuit board 300 which is secured in the lower section 58 of the nosepiece 16 of the foot cradle assembly 10 as is shown in FIG. 3. Referring once again to FIG. 4, the tuning/impedance matching network basically comprises a shunt capacitor pair 302, a series capacitor pair 308, a passive clamping circuit 314 and an active clamping element 320. The shunt capacitor pair 302 and the series capacitor pair 308 each comprise a trimming capacitor 304 and 310 and a fixed capacitor 306 and 312 connected in parallel. The trimming capacitors 304 and 310 are utilized to provide for clinical tuning with the subject's foot inserted into the foot cradle assembly 10 to provide the best image quality. The shunt capacitor pair 302 is utilized to transfer the impedance to a unit reactance and the series capacitor pair 308 is utilized to transfer the unit reactance to 50 ohms. The two capacitor, pairs 302 and 308 work in concert with a single capacitor 322 to provide the tuning/impedance matching network with the capability of adjusting the resonant frequency and matching the impedance of the network to the transmission line utilized to connect the magnetic resonance imaging receiver system to the MRI device. The tuning/impedance matching network is connected to the MRI device via a standard BNC connector 324 supporting a 50 ohm characteristic impedance coaxial line. The passive clamping circuit 314 comprises a pair of diodes 316 and 318 connected in parallel across the network and between the shunt capacitor pair 302 and the series capacitor pair 308. The passive clamping circuit 314 prevents high voltage levels due to induced signals during the MRI excitation phase from circulating through the network. The active clamping element 320 comprises a single diode connected in parallel to the passive clamping element 314, but on the output side of the series capacitor pair 308, and is therefore DC isolated from the remaining portion of the network. The single diode 320 simply performs a redundant clamping function. The diode is turned on actively by a pulse supplied by the MRI device in synchronism with the transmit periods.

The tuning/impedance matching circuit is designed as a high Q circuit. Accordingly, a narrow bandwidth results, thereby resulting in a circuit which is difficult to match and not tolerant to component variation. Accordingly, clinical tuning of the circuit is necessary because of the high Q design, therefore, if a lower Q circuit is utilized, the need for clinical tuning may be eliminated. A low Q circuit provides for a greater bandwidth and therefore easier matching; however, a lower Q circuit has more transmission loss. If it is possible to work with the increased transmission loss, a lower Q circuit would eliminate the need for clinical tuning. Accordingly, a trade off is necessary to achieve the desirable characteristics that each type of circuit can provide. It is possible to design the tuning/impedance matching circuit with a Q exceeding 100 and have no need for retuning for this application.

FIG. 7 provides a perspective view of the foot cradle assembly 10 and the two printed circuit boards 100 and 200. As is shown in the figure, the printed circuit boards 100 and 200 fit into the gap between the inner and outer surfaces 34 and 36 of the double walled side walls 12 and 14. The antenna coils 102 and 202 face the outside of the foot cradle assembly 10 and away from the subject's foot for safety reasons as explained above. The printed circuit boards 100 and 200 are easily inserted into and removed from the foot cradle assembly 10 by the forward tabs 112 and 212, which fit in the tabs 38 and 40 of the double walled side walls 12 and 14 respectively. FIG. 8 illustrates a top view of the foot cradle assembly 10. The subject's leg 92 is placed within the foot cradle assembly 10 such that the subject's heel 94 rests upon the transverse wall 22 and the back of the leg 92 rests upon the base 18. The subject's leg 92 is held in place by the shin restraining strap 56 and the subject's heel 94 is held in place by the toe/foot restraining strap 46. The shin restraining strap 56 fits through slots 52 and 54, around the shin region of the subject's leg 92, and is secured to the side rails 24 and 26. The toe/foot restraining strap 46 fits through slots 48 and 58, around the region just above the toes of the subject's leg 92, and is secured to restraining handles 28 and 30.

The magnetic resonance imaging receiver system can also be utilized for a process known as magnetic resonance angiography (MRA). MRA involves utilizing magnetic resonance imaging techniques to evaluate blood flow in the lower extremities; namely, the foot and ankle regions of the patient. Currently available MRI devices cannot effectively be utilized for this time of flight imaging because it is difficult to hold the patient's foot still. Accordingly, the foot cradle assembly 10, which is constructed specifically to rigidly hold and support the foot and ankle regions of the patient, provides the necessary means for MRA.

Although shown and described is what is believed to be the most practical and preferred embodiments, it is apparent that departures from specific methods and designs described and shown will suggest themselves to those skilled in the art and may be used without departing from the spirit and scope of the invention. The present invention is not restricted to the particular constructions described and illustrated, but should be construed to cohere with all modifications that may fall within the scope of the appended claims.

What is claimed is:

1. A magnetic resonance imaging receiver system for producing high resolution images of the foot and ankle regions of a human subject, said system comprising:
   (a) antenna means for receiving resonance signals produced by a magnetic resonance imaging, radio frequency excitation magnet apparatus, said antenna means comprising at least two antenna coils formed on printed circuit boards on either side of the foot and ankle regions of said human subject;
   (b) a foot cradle assembly for supporting and rigidly holding the foot and ankle of said human subject, said foot cradle assembly houses said at least two antenna coils at a predetermined fixed distance from one another and maintains them in a parallel orientation such that the resonance signals are not biased by the orientation of said at least two antenna coils; and
   (c) tuning/impedance matching means mounted within said foot cradle assembly, for providing a maximum transfer of radio frequency energy from said antenna means to a receiver of said magnetic resonance imaging, radio frequency excitation magnet apparatus.

2. The magnetic resonance imaging receiver system according to claim 1, wherein said at least two antenna coils are formed in a rectangular coil configuration on said printed circuit boards.

3. The magnetic resonance imaging receiver system according to claim 2, wherein said at least two antenna coils are formed from copper and coated with tin to prevent oxidation.

4. The magnetic resonance imaging receiver system according to claim 3, wherein said at least two antenna coils each comprise first and second capacitors, said first and second capacitors being serially connected in each of said at least two antenna coils for resonating the at least two antenna coils to operate at or near a Larmor frequency and to force a uniform magnetic field between said at least two antenna coils.

5. The magnetic resonance imaging receiver system according to claim 4, wherein said foot cradle assembly comprises:
   (a) a pair of double walled side walls each having a gap between an inner and outer surface thereof for holding said printed circuit boards in a parallel orientation;
   (b) a nosepiece being positioned between and connecting said pair of double walled side walls, said nosepiece having an upper and lower section, said lower section housing said tuning/impedance matching means;
   (c) a base connected to said pair of double walled side walls and said nosepiece, and serving as a platform therefor;
   (d) a transverse bar positioned between said double walled side walls opposite said nosepiece maintaining said double walled side walls in parallel orientation with respect to one another;
   (e) a transverse wall positioned between said double walled side walls and directly over said nosepiece, said transverse wall serving as a backstop for the foot of said human subject;
   (f) a pair of side rails connecting said double walled side walls to said base providing structural rigidity to said foot cradle assembly;
   (g) a strap, and;
   (h) first and second restraining handles mounted on said double walled side walls for securing the strap around the foot of said human subject to hold the foot securely in place, said double walled side walls having slots in proximity to said first and second restraining handles through which said strap is fed.

6. The magnetic resonance imaging receiver system according to claim 5, wherein said pair of double walled side walls each comprise tabs for the easy insertion and removal of said at least two antenna coils.

7. The magnetic resonance imaging receiver system according to claim 6, wherein said nosepiece is constructed in semicircular cross-section for preventing said human subject from walking in said foot cradle assembly, said lower section of said nosepiece comprising a removable tray which securely holds said tuning/impedance matching means within said lower section, a pair of tuning ports adjusting the tuning/impedance matching means, and a connector means for connecting said magnetic imaging receiver system to said magnetic resonance imaging, radio frequency excitation magnetic apparatus.

8. The magnetic resonance imaging receiver system according to claim 7, wherein said pair of side rails comprise openings through which shin straps are secured to hold the shin of said human subject.

9. The magnetic resonance imaging receiver system according to claim 8, wherein said tuning/impedance matching means comprises:
   (a) a shunt element transferring a network impedance of the system to a unit reactance, said shunt element comprising a first fixed capacitor and a first trimmable capacitor connected in parallel;

(b) a series element for transferring the unit reactance to a predetermined impedance which is matched to the means for connecting said magnetic resonance imaging receiver system to said magnetic resonance imaging, radio frequency excitation magnet apparatus, said series element comprising a second fixed capacitor and a second trimmable capacitor connected in parallel;

(c) a passive clamping circuit for preventing high voltage levels due to induced signals during an MRI excitation phase from circulating in said tuning/impedance matching means, said passive clamping circuit comprising a diode pair connected in parallel between said shunt element and said series element; and (d) an active clamping element connected on the output side of said series element, said active clamping element is a diode for preventing high voltages from circulating in said tuning/impedance matching means due to induced signals during an MRI excitation phase.

10. The magnetic resonance imaging receiver system according to claim 9, wherein said tuning/impedance matching means further comprises a single capacitor which in conjunction with said shunt element and said series element permits adjustment of the resonant frequency at or near the Larmor frequency and impedance matching to a transmission line connecting said magnetic resonance imaging receiver system to said magnetic resonance imaging, radio frequency excitation magnet apparatus.

11. The magnetic resonance imaging receiver system according to claim 5, wherein said foot cradle assembly is formed from a non-ferrous material and the interior portions thereof are lined with a closed-cell foam for customizing said foot cradle assembly to the foot of said human subject.

12. A magnetic resonance imaging receiver system for producing high resolution images of the foot and ankle regions of a human subject, said system comprising:

(a) antenna means for receiving resonance signals produced by a magnetic resonance imaging, radio frequency excitation magnet apparatus, said antenna means comprising at least two identical antenna coils formed on printed circuit boards on either side of the foot and ankle regions of said human subject, said at least two identical antenna coils having a left/right symmetry for mounting on opposite sides of the foot and ankle regions of said human subject;

(b) a free standing foot cradle assembly for supporting and rigidly holding the foot and ankle of said human subject, said foot cradle assembly houses said at least two antenna coils at a predetermined fixed distance from one another and maintains them in a parallel orientation such that the resonance signals are not biased by the orientation of said at least two antenna coils; and (c) tuning/impedance matching means mounted within said foot cradle assembly, for providing a maximum transfer of radio frequency energy from said antenna means to a receiver of said magnetic resonance imaging, radio frequency excitation magnet apparatus.

13. The magnetic resonance imaging receiver system according to claim 12, wherein said at least two identical antenna coils are formed in a rectangular coil configuration with copper and coated with tin to prevent oxidation, said at least two identical antenna coils are formed on said printed circuit boards such that said printed circuit boards are closer to the foot of said human subject then said at least two identical antenna coils.

14. The magnetic resonance imaging receiver system according to claim 13, wherein said at least two antenna coils each comprise first and second capacitors, said first and second capacitors being serially connected in each of said at least two antenna coils for resonating the at least two antenna coils to operate at or near a Larmor frequency and to force a uniform magnetic field between said at least two antenna coils.

15. The magnetic resonance imaging receiver system according to claim 14, wherein said foot cradle assembly comprises:

(a) a pair of double walled side walls each having a gap between an inner and outer surface thereof for holding said printed circuit boards in a parallel orientation;

(b) a nosepiece being positioned between and connecting said pair of double walled side walls, said nosepiece having an upper and lower section, said lower section housing said tuning/impedance matching means;

(c) a base connected to said pair of double walled side walls and said nosepiece, and serving as a platform therefor;

(d) a transverse bar positioned between said double walled side walls opposite said nosepiece maintaining said double walled side walls in parallel orientation with respect to one another;

(e) a transverse wall positioned between said double walled side walls and directly over said nosepiece, said transverse wall serving as a backstop for the foot of said human subject;

(f) a pair of side rails connecting said double walled side walls to said base providing structural rigidity to said foot cradle assembly;

(g) a strap, and;

(h) first and second restraining handles mounted on said double walled side walls for securing the strap around the foot of said human subject to hold the foot securely in place, said double walled side walls having slots in proximity to said first and second restraining handles through which said strap.

16. The magnetic resonance imaging receiver system according to claim 15, wherein said pair of double walled side walls each comprise tabs for the easy insertion and removal of said at least two antenna coils.

17. The magnetic resonance imaging receiver system according to claim 16, wherein said nosepiece is constructed in semicircular cross-section for preventing said human subject from walking in said foot cradle assembly, said lower section of said nosepiece comprising a removable tray which securely holds said tuning/impedance matching means within said lower section, a pair of tuning ports adjusting the tuning/impedance matching means, and a connector means for connecting said magnetic imaging receiver system to said magnetic resonance imaging, radio frequency excitation magnetic apparatus.

18. The magnetic resonance imaging receiver system according to claim 17, wherein said pair of side rails comprise openings through which shin straps are secured to hold the shin of said human subject.

19. The magnetic resonance imaging receiver system according to claim 18, wherein said tuning/impedance matching means comprises:
(a) a shunt element transferring a network impedance of the system to a unit reactance, said shunt element comprising a first fixed capacitor and a first trimmable capacitor connected in parallel;
(b) a series element for transferring the unit reactance to a predetermined impedance which is matched to the means for connecting said magnetic resonance imaging receiver system to said magnetic resonance imaging, radio frequency excitation magnet apparatus, said series element comprising a second fixed capacitor and a second trimmable capacitor connected in parallel;
(c) a passive clamping circuit for preventing high voltage levels due to induced signals during an MRI excitation phase from circulating in said tuning/impedance matching means, said passive clamping circuit comprising a diode pair connected in parallel between said shunt element and said series element; and
(d) an active clamping element connected on the output side of said series element, said active clamping element is a diode for preventing high voltages from circulating in said tuning/impedance matching means due to induced signals during an MRI excitation phase.

20. The magnetic resonance imaging receiver system according to claim 19, wherein said tuning/impedance matching means further comprises a single capacitor which in conjunction with said shunt element and said series element permits adjustment of the resonant frequency at or near the Larmor frequency and impedance matching to a transmission line connecting said magnetic resonance imaging receiver system to said magnetic resonance imaging, radio frequency excitation magnet apparatus.

21. The magnetic resonance imaging receiver system according to claim 20, wherein said tuning/impedance matching means comprise non-ferrous materials.

22. The magnetic resonance imaging receiver system according to claim 15, wherein said foot cradle assembly is formed from a non-ferrous material and the interior portions thereof are lined with a closed-cell foam for customizing said foot cradle assembly to the foot of said human subject.

* * * * *